(12) United States Patent
Viswanath

(10) Patent No.: US 6,888,722 B2
(45) Date of Patent: May 3, 2005

(54) THERMAL DESIGN FOR MINIMIZING INTERFACE IN A MULTI-SITE THERMAL CONTACT CONDITION

(75) Inventor: Ram S. Viswanath, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/723,108

(22) Filed: Nov. 25, 2003

(65) Prior Publication Data

US 2004/0104467 A1 Jun. 3, 2004

Related U.S. Application Data

(63) Continuation of application No. 09/475,103, filed on Dec. 30, 1999, now abandoned.

(51) Int. Cl.[7] ................................................. H05H 7/20
(52) U.S. Cl. ...................... 361/704; 165/185; 174/16.3; 257/707; 257/713; 361/708; 361/700
(58) Field of Search ................................ 165/80.3, 185, 165/DIG. 44; 174/16.3; 257/706–707, 712–713; 361/700, 704–722

(56) References Cited

U.S. PATENT DOCUMENTS

| | | | | | |
|---|---|---|---|---|---|
| 4,602,314 A | * | 7/1986 | Broadbent | ................... | 361/719 |
| 4,915,167 A | * | 4/1990 | Altoz | ......................... | 165/185 |
| 5,097,387 A | * | 3/1992 | Griffith | ........................ | 361/699 |
| 5,289,337 A | * | 2/1994 | Aghazadeh et al. | ........ | 361/718 |
| 5,323,294 A | * | 6/1994 | Layton et al. | ............... | 361/699 |
| 5,548,482 A | * | 8/1996 | Hatauchi et al. | ............ | 361/720 |
| 5,617,294 A | * | 4/1997 | Watson et al. | ............... | 361/719 |
| 5,699,227 A | * | 12/1997 | Kolman et al. | .............. | 361/700 |
| 5,748,446 A | * | 5/1998 | Feightner et al. | ........... | 361/709 |
| 5,831,831 A | * | 11/1998 | Freeland | ..................... | 361/704 |
| 5,880,524 A | * | 3/1999 | Xie | ............................. | 257/704 |
| 5,883,782 A | * | 3/1999 | Thurston et al. | ............ | 361/704 |
| 5,894,408 A | * | 4/1999 | Stark et al. | .................. | 361/704 |
| 5,895,972 A | * | 4/1999 | Paniccia | ...................... | 257/706 |
| 5,898,219 A | * | 4/1999 | Barrow | ........................ | 257/713 |
| 5,903,436 A | * | 5/1999 | Brownell et al. | ........... | 361/704 |
| 5,917,702 A | * | 6/1999 | Barrow | ........................ | 361/704 |
| 5,920,120 A | * | 7/1999 | Webb et al. | ................. | 257/719 |
| 5,923,086 A | * | 7/1999 | Winer et al. | ................. | 257/713 |
| 5,933,323 A | * | 8/1999 | Bhatia et al. | ................ | 361/700 |
| 5,936,838 A | * | 8/1999 | Lii et al. | ...................... | 361/705 |
| 5,949,647 A | * | 9/1999 | Kolman et al. | .............. | 361/700 |
| 5,965,937 A | * | 10/1999 | Chiu et al. | ................... | 257/716 |
| 5,969,944 A | * | 10/1999 | Borkar et al. | ............... | 361/699 |
| 5,978,228 A | * | 11/1999 | Borkar et al. | ............... | 361/753 |
| 5,990,549 A | * | 11/1999 | Chiu et al. | ................... | 257/706 |
| 6,008,988 A | * | 12/1999 | Palmer | ........................ | 361/704 |
| 6,011,696 A | * | 1/2000 | Mahajan et al. | ............ | 361/782 |
| 6,016,006 A | * | 1/2000 | Kolman et al. | .............. | 257/712 |
| 6,028,771 A | * | 2/2000 | Wong et al. | ................. | 361/704 |
| 6,030,251 A | * | 2/2000 | Stark et al. | .................. | 439/377 |
| 6,043,560 A | * | 3/2000 | Haley et al. | ................. | 257/706 |
| 6,043,984 A | * | 3/2000 | Tseng | .......................... | 361/704 |
| 6,046,905 A | * | 4/2000 | Nelson et al. | ............... | 361/704 |
| 6,046,906 A | * | 4/2000 | Tseng | .......................... | 361/704 |
| 6,054,198 A | * | 4/2000 | Bunyan et al. | ............. | 428/40.5 |
| 6,084,775 A | * | 7/2000 | Bartley et al. | .............. | 361/705 |

* cited by examiner

*Primary Examiner*—Gregory D. Thompson
(74) *Attorney, Agent, or Firm*—Blakely, Sokoloff, Taylor & Zafman LLP

(57) ABSTRACT

An electronic assembly that may include an integrated circuit package that is mounted to a substrate. The assembly may have a thermally conductive phase change material that couples the integrated circuit package to a thermal element. The phase change material may be assembled in a liquid phase to fill any gap between the package and the thermal element. The phase change material may exist in a solid phase during normal operation of the assembly so that the material does not bleed from the package/thermal element interface.

9 Claims, 2 Drawing Sheets

THERMAL DESIGN FOR MINIMIZING INTERFACE IN A MULTI-SITE THERMAL CONTACT CONDITION

This is a continuation of U.S. Pat. No. 09/475,103 filed Dec. 30, 1999, which is now abandoned.

BACKGROUND OF THE INVENTION

1. Field of the Invention

The present invention relates to a phase change material that couples an integrated circuit package to a thermal element.

2. Background Information

FIG. 1 shows an electronic assembly 1 of the prior art. The assembly 1 includes a first integrated circuit package 2 and a second integrated circuit package 3 that are mounted to a substrate 4. The substrate 4 may be a printed circuit board such as a motherboard, or the circuit board of a cartridge that can be plugged into a motherboard. The first integrated circuit package 2 may contain an integrated circuit (not shown) such as a microprocessor. The second integrated circuit package 3 may contain a memory device such as a static random access memory (SRAM) integrated circuit.

The integrated circuits generate heat that must be removed from the packages. A thermal element 5 may be coupled to the packages to facilitate the removal of the heat. The thermal element 5 may be an aluminum or copper plate that is attached to the substrate 4 and coupled to the top surfaces of the packages 2 and 3. Heat flows through the packages 2 and 3 and into the thermal element 5. The thermal element 5 increases the effective surface area and the resultant heat transfer into the ambient.

The first integrated circuit package 2 may have a height that is greater than the second integrated circuit package 3. The difference in height may create an air gap between the thermal element 5 and the second package 3. Additionally, tolerances in the assembly 1 may also create air gaps between the thermal element 5 and both packages 2 and 3.

Air gaps increase the thermal impedance between the thermal element 5 and the packages 2 and 3. The higher impedance increases the junction temperatures of the integrated circuits. The air gaps may be filled with thermal grease 6 located between the thermal element 5 and the packages 2 and 3. The grease 6 is typically applied to the thermal element 5, or integrated circuit packages 2 and 3, before the element 5 is assembled onto the packages 2 and 3.

The thermal grease 6 has a thermal conductivity that is greater than the thermal conductivity of air. The thermal grease is compliant enough to compensate for variations in the thickness of each air gap. Unfortunately, it has been found that thermal grease may pump or bleed out of the space between the thermal element 5 and packages 2 and 3 and leave an air gap. It would be desirable to provide a compliant thermally conductive material that can couple the thermal element to the packages and will not bleed out of the package/element interface during the life of the assembly.

SUMMARY OF THE INVENTION

One embodiment of the present invention is an electronic assembly which may include an integrated circuit package that is mounted to a substrate. The assembly may have a thermally conductive phase change material that couples the integrated circuit package to a thermal element.

DETAILED DESCRIPTION

Figure 1:
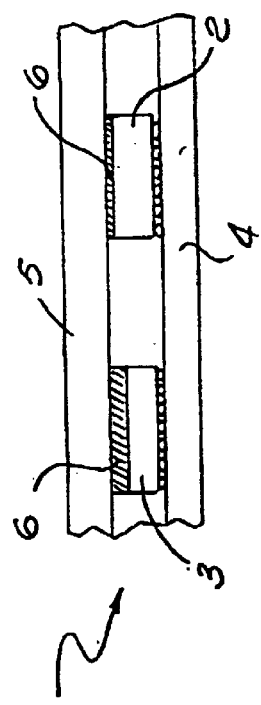
FIG. 1 is a top view of an electronic assembly of the prior art.
Figure 2:
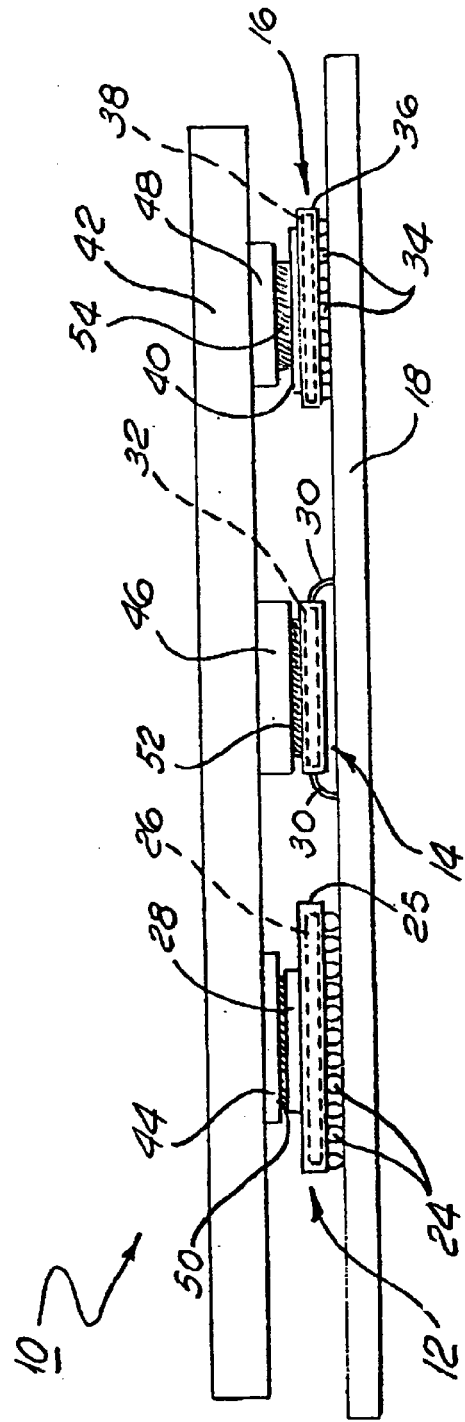
FIG. 2 is a top view of an embodiment of an electronic assembly of the present invention.
Figure 3:
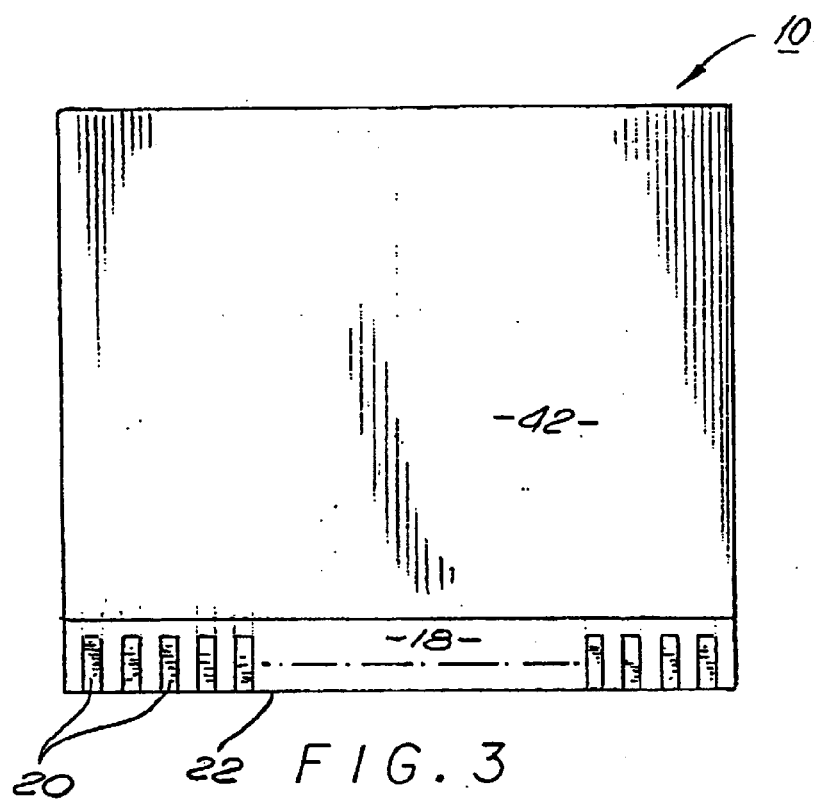
FIG. 3 is a side view of the electronic assembly.

Referring to the drawings more particularly by reference numbers, FIGS. 2 and 3 show an embodiment of an electronic assembly 10 of the present invention. By way of example, the electronic assembly 10 may be a cartridge that can be plugged into a motherboard of a computer. The assembly 10 may include a first integrated circuit package 12, a second integrated circuit package 14, and a third integrated circuit package 16 that are mounted to a substrate 18. The substrate 18 may be a printed circuit board which has routing traces and power/ground planes (not shown) that electrically connect the packages 12, 14 and 16 to each other and to conductive pads 20 located along a substrate edge 22 shown in FIG. 3. The contact pads 20 can be plugged into a corresponding connector (not shown).

Referring to FIG. 2, the first integrated circuit package 12 may include a plurality of solder balls 24 that are connected to the substrate 18 and a package substrate 25. The first package 12 may be an organic land grid array (OLGA) type package. The package substrate 25 may electrically connect the solder balls 24 to a first integrated circuit 26 within the package 12. By way of example, the first integrated circuit 26 may be a microprocessor. The first package 12 may further have a thermally conductive lid 28 that is thermally coupled to the integrated circuit 26.

The second integrated circuit package 14 may include a plurality of leads 30 that are connected to the substrate 18 and an integrated circuit 32 within the package 14. The second package 14 may be a quad flat pack (QFP) type package. The second integrated circuit 32 may be a static random access memory (SRAM) device that provides a level 1 cache for the microprocessor.

The third integrated circuit package 16 may include a plurality of solder balls 34 that are connected to the substrate 18 and a package substrate 36. The second package 16 may be an OLGA type package. The package substrate 36 may electrically connect the solder balls 34 to a third integrated circuit 38 within the package 16. By way of example, the first integrated circuit 38 may be a level 2 cache for the microprocessor. The third package 16 may further have a thermally conductive lid 40 that is thermally coupled to the integrated circuit 38.

The assembly 10 may include a thermal element 42 that is attached to the substrate 18 and thermally coupled to the integrated circuit packages 12, 14 and 16. The thermal element 42 may be a plate that is constructed from a thermally conductive material such as aluminum or copper. The integrated circuit packages 12, 14 and 16 may each have different heights that create different spaces between the thermal element 42 and each package 12, 14 and 16. The thermal element 42 may have a first pedestal 44, a second pedestal 46, and a third pedestal 48 that extend toward the packages 12, 14 and 16, respectively, to minimize the gaps between the element 42 and the packages 12, 14 and 16. Each pedestal 44, 46 and 48 may have a height that corresponds to the height of the packages 12, 14 and 16.

The integrated circuit packages 12, 14 and 16 may be coupled to the pedestals 44, 46 and 48 by a first thermally conductive phase change pad 50, a second thermally conductive phase change pad 52 and a third thermally conductive phase change pad 54, respectively. Each phase change pad 50, 52 and 54 provides a compliant thermal element that fills the spaces between the packages 12, 14 and 16, and the thermal element 42. The thickness of each pad 50, 52 and 54 may vary depending upon the height of each package 12, 14 and 16, and pedestal 44, 46 and 48.

Figure 4:
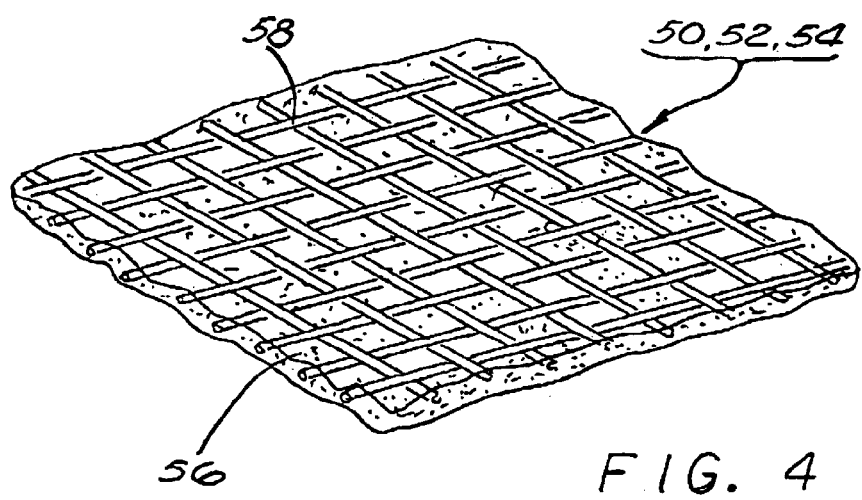
FIG. 4 is a perspective view of a thermally conductive phase change pad of the electronic assembly.

FIG. 4 shows an embodiment of a phase change pad 50, 52, or 54 which has a phase change material 56 that is embedded into a mesh 58. The phase change material 56 may include a poly-olefin so that the material changes from a solid state to a liquid state at a predetermined temperature. The phase change temperature is typically above the operating temperature of the assembly 10. By way of example, the phase change temperature may be between 45–50 degrees centigrade (° C.). The mesh 58 may be a woven fiberglass.

The phase change material 56 may have thermally conductive filler material such as carbon to provide a conductive medium between the packages 12, 14 and 16, and the thermal element 42. The phase change material may include by volume, 85–90% thermally conductive filler and 2–3% poly-olefin material. By way of example, the phase change material may be a product sold by Chomerics under the part number T44x series, or by Thermagon under the T-pcm 900 series part number.

To assemble the assembly 10, the packages 12, 14 and 16 can be initially mounted to the substrate 18. The pads 50, 52 and 54 can then be placed on top of the packages 12, 14 and 16. The pads 50, 52 and 54 can be heated so that the phase change material 56 changes to the liquid, or partial liquid, state. The thermal element 42 may then be placed onto the pads 50, 52 and 54. The weight of the thermal element 42 may push the pedestals 44, 46 and 48 into the pads 50, 52 and 54 to insure that no air gaps exist between the element 42 and the packages 12, 14 and 16. The pads 50, 52 and 54 are then allowed to cool so that the phase change material 56 changes back to the solid state and is attached to the thermal element 42 and the packages 12, 14 and 16.

In the solid state the pads 50, 52 and 54 provide a conductive path between the packages 12, 14 and 16 and the thermal element 42. The phase change temperature is typically above the operating temperature of the assembly 10 so that the phase change material does not change to the liquid state and bleed out of the package/thermal element interface when the integrated circuits 26, 32 and 38 are operating. As an alternate method the phase change pads 50, 52 and 54 may be heated to the liquid state after the thermal element 42 is placed onto the pads 50, 52 and 54.

The phase change pads 50, 52 and 54 provide components that can provide a thermally conductive path between the thermal element 42 and packages 12, 14 and 16 without bleeding during operation. Additionally, assembling the pads 50, 52, 54, the thermal element 42 and the packages 12, 14 and 16 when the phase change material 56 is in the liquid state insures that there are no air-gaps between the packages 12, 14 and 15 and element 42 when the phase change material changes back to the solid state.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly comprising:
   a substrate;
   a first integrated circuit package mounted to said substrate;
   a first phase change pad including a mesh embedded into a first thermally conductive phase change material, the first phase change pad being coupled to said first integrated circuit package;
   a second integrated circuit package mounted to said substrate;
   a second phase change pad including a mesh embedded into a second thermally conductive phase change material, the second phase change pad being thicker than the first phase change pad and coupled said second integrated circuit package; and
   a thermal element coupled to both said first phase change pad and said second first phase change pad.

2. The assembly of claim 1, wherein said first thermally conductive phase change material and said second thermally conductive phase change material includes a poly-olefin.

3. The assembly of claim 2, wherein said first thermally conductive phase change material and said second thermally conductive phase change material includes a thermally conductive filler material being substantially greater in volume than said poly-olefin.

4. The assembly of claim 1, wherein said first thermally conductive phase change material changes from a solid state to a liquid state at approximately 45 to 50 degrees centigrade.

5. The assembly of claim 1, wherein said substrate has a plurality of conductive pads along an edge of said substrate.

6. An electronic assembly, comprising:
   a substrate;
   a first integrated circuit package mounted to said substrate;
   a second integrated circuit package mounted to said substrate;
   a thermal element that is separated from said first integrated circuit package by a first distance and from said second integrated circuit package by a second distance which is greater than the first distance;
   a first thermally conductive phase change pad that couples said first integrated circuit package to said thermal element, said first thermally conductive phase change pad includes a first thermally conductive phase change material; and,
   a second thermally conductive phase change pad that couples said second integrated circuit package to said thermal element, said second thermally conductive phase change pad includes a second thermally conductive phase change material embedded into a mesh and sized with a thickness greater than a thickness of the first thermally conductive phase change pad.

7. The assembly of claim 6, wherein both said first thermally conductive phase change material and said second thermally conductive phase change material includes a poly-olefin.

8. The assembly of claim 7, wherein said first thermally conductive phase change material and said second thermally conductive phase change material includes a thermally conductive filler material being substantially greater in volume than said poly-olefin.

9. The assembly of claim 6, wherein said first thermally conductive phase change material changes from a solid state to a liquid state at approximately 45 to 50 degrees centigrade.

* * * * *